United States Patent [19]
Kim et al.

[11] Patent Number: 5,666,271
[45] Date of Patent: Sep. 9, 1997

[54] RACK FOR A COMMUNICATION SYSTEM

[75] Inventors: Tae-Ryong Kim; Yong-Sang Ahn; Chel-Hee Lee, all of Gumi, Rep. of Korea

[73] Assignee: SamSung Electronics Co., Ltd., Suwon, Rep. of Korea

[21] Appl. No.: 718,189

[22] Filed: Sep. 19, 1996

[30] Foreign Application Priority Data

Sep. 19, 1995 [KR] Rep. of Korea ............... 30736/1995

[51] Int. Cl.⁶ ............... H05K 7/16; H05K 1/14
[52] U.S. Cl. .................. 361/726; 361/727; 361/740; 361/741; 361/747; 439/377
[58] Field of Search .................. 361/724–728, 361/736, 740, 741, 747, 748, 752, 756, 759, 784, 796, 797, 683–686, 802, 825, 829; 312/223.1, 223.6; 211/41, 26; 439/61, 64, 69, 377, 378, 354

[56] References Cited

U.S. PATENT DOCUMENTS

| | | |
|---|---|---|
| 4,686,608 | 8/1987 | Hosking . |
| 4,829,432 | 5/1989 | Hershberger et al. . |
| 4,894,753 | 1/1990 | Wadell et al. . |
| 5,053,925 | 10/1991 | Kitajima ........................... 361/725 |
| 5,229,924 | 7/1993 | Zell . |

Primary Examiner—Leo P. Picard
Assistant Examiner—Phuong T. Vu
Attorney, Agent, or Firm—Robert E. Bushnell, Esq.

[57] ABSTRACT

A rack for a communication system as, including a backboard having a first side, a second side, a connector capable of being connected to an electrical communication cable, and a plurality of through apertures. A first side panel has an open slot and a closed slot. The first side panel is connected to the first side of the backboard while a second side panel having a grooved slot is connected to the second side of the backboard. A rear panel has a first flange for detaining the first side panel, a second flange for detaining the second side panel, and first and second longitudinal detaining units for positioning strips perforated by columns of holes aligned with through apertures. The first and second longitudinal detaining units are located at sides of the rear panel. The strips are insertable into one of said strip detaining units. A plurality of guide plates have guide pins and a rear side. The guide plates, when installed, are inter-locked with the first side panel, the second side panel, the backboard, and the rear panel, with the guide pins projecting from the rear and passing through the through apertures of the backboard and into the holes in the corresponding strips, thereby attaching the rear panel to the backboard. The guide pins detain the backboard so as to maintain distance between the guide plates.

20 Claims, 5 Drawing Sheets

RACK FOR A COMMUNICATION SYSTEM

CLAIM OF PRIORITY

This application makes reference to, incorporates the same herein, and claims all benefits accruing under 35 U.S.C. §119 from an application for A RACK IN A COMMUNICATION SYSTEM earlier fried in the Korean Industrial Property Office on the 19th day of Sep. 1995, and duly assigned Ser. No. 30736/1995.

BACKGROUND OF THE INVENTION

1. Technical Field

The present application is for a rack, and more particularly, to a rack for mounting a communication system including communication apparatus and the components of that apparatus.

2. Background Art

Today, the art of communication involves equipment that requires many components. As each component (e.g., switches, transmitters, boards, and modular elements) has a chance of being manufactured incorrectly, having more components increases the chance of a manufacturing error per equipment. Therefore, reducing the chance of a manufacturing error is important. One way of reducing the chance of a manufacturing error is to reduce the overall number of components. With fewer overall parts, manufacturing involves a lesser number of assembly steps for a reduced number of parts, thus reducing the chance for occurrence of an assembly error. Another way of reducing the chance for a manufacturing error is to have fewer number of types of components. With fewer types of components, the manufacturing involves less component fabrication, thus reducing the chance of component fabrication error. This goal of reducing the manufacturing error is balanced by the need to have equipment that is just as functional as any other equipment. The challenge is to have equipment that has a smaller chance of being manufactured incorrectly, but is just as functional as other equipment of its type.

In the past, a rack for communication apparatus consisted of many components, such as walls, nuts, bolts, and other items. Constructing such a rack according to contemporary practice requires a large number of dissimilar components. Further, assembling such components requires a large set of the fasteners such as screws, bolts, or rivets essential for joining the parts together. According to conventional practice, a sub-rack structure with separate shelves and a large number of locking pieces is required for installation of the various necessary components, a bottleneck on productivity. Comparable problems are attributable to racks and card cages assembled from stamped, punched, and slotted sheet material as represented by, for example, the Electrical Circuitry Support Apparatus of Wadell, U.S. Pat. No. 4,894, 753. Due to these requirements for assembly of shelves, the product quality is at risk of deterioration while the per unit cost is increased. Also, the performance of the communication system can be impaired. In a communication system, a PBA board connector and a backboard connector should be precisely coupled to assure continuous long-term reliable communication. In a conventional sub-rack structure with shelves, because various components are assembled by a set of locking fasteners, the cumulative effect of out of tolerance parts all too often exceeds the tolerance limit of the overall system.

Examples of the art, such as Zell (Cabinet for the Acceptance of Electrical Card Cages, U.S. Pat. No. 5,229,924, Jul. 20, 1993) teach a cabinet system of one or more card cages. Hershberger et al. (Apparatus for Shielding an Electrical Circuit from Electromagnetic Interference, U.S. Patent No. 4,829,432, May. 9, 1989) proposes to join a ground player layer with a solder joint while Hosking (Electronic Equipment Rack Interconnection System, U.S. Pat. No. 4,686,608, Aug. 11, 1987) discusses a rack assembly using a mating connector assembly. Constructing such racks according to contemporary practice requires a large number of dissimilar components. Moreover, according to contemporary practice, such racks do not have a single part that holds all other parts together.

SUMMARY OF THE INVENTION

To solve the above problems, it is an object of the present invention to provide an improved rack for mounting communication systems.

It is another object to provide a simplified rack shelf manufactured with fewer components.

It is still another object to provide a guide plate constructed with projecting members serving as locking devices without requiring a separate locking components.

It is yet another object to provide a rack with shelves while assuring the product quality and minimizing the per unit cost by using a simple locking structure to assemble the rack.

It is still yet another object to provide a rack with telecommunications equipment assembled from self-locking plates and panels.

To accomplish these and other objects, there is provided a rack for a communication system as, including a backboard having a first side, a second side, a connector capable of being connected to an electrical communication cable, and a plurality of through apertures. A first side panel has an open slot and a dosed slot. The first side panel is connected to the first side of the backboard while a second side panel having a grooved slot is connected to the second side of the backboard. A rear panel has a first flange for detaining the first side panel, a second flange for detaining the second side panel and first and second longitudinal detaining units for positioning strips perforated by columns of holes aligned with through apertures. The first and second longitudinal detaining units are located at sides of the rear panel. The strips are insertable into one of said strip detaining units. A plurality of guide plates have guide pins and a rear side. The guide plates, when installed, are inter-locked with the first side panel, the second side panel, the backboard, and the rear panel, with the guide pins projecting from the rear side and passing through the through apertures of the backboard and into the holes in the corresponding strips, thereby attaching the rear panel to the backboard. The guide pins detain the backboard so as to maintain distance between the guide plates.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
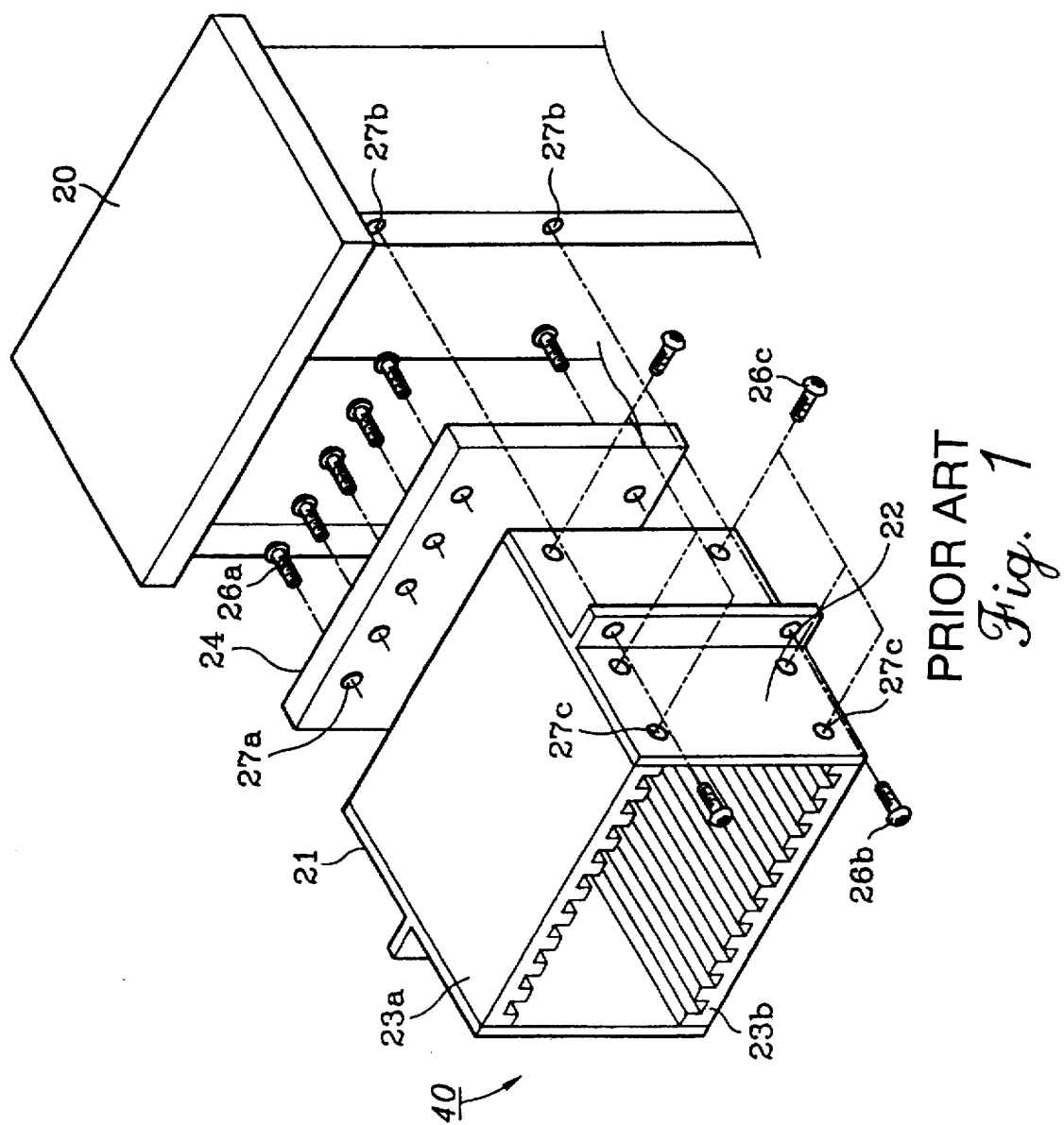
FIG. 1 is an exploded perspective view of a representation of a hypothetical conventional rack.

FIG. 1 shows the details of a representation of a hypothetical conventional rack for a communication apparatus. A typical construction of such a conventional shelf-sub rack 40 involves an upper guide plate 23a and a base guide plate 23b at opposite sides. The upper and base guide plates 23a and 23b and left and right side panels 21 and 22 are joined through a pierced locking aperture 27c of the panels 21 and 22, using bolts 26c. Then, the back of the resulting structure is joined by a backboard 24 through locking apertures 27a, using bolts 26a. Next, the shelf sub-rack 40 is joined to a shelf sub-rack assembling rack 20 through locking apertures 27b located in the left and right side panels 21 and 22 using bolts 26b, thus completing the basic structure for an overall rack. After the assembly, a separate rack and a cabinet are locked and installed by fasteners, thus completing the installation of a conventional shelf-structure system. Constructing such a rack requires a large of components. Further, assembling such components requires a large set of fastening parts such as screws, bolts, or rivets.

Figure 2:
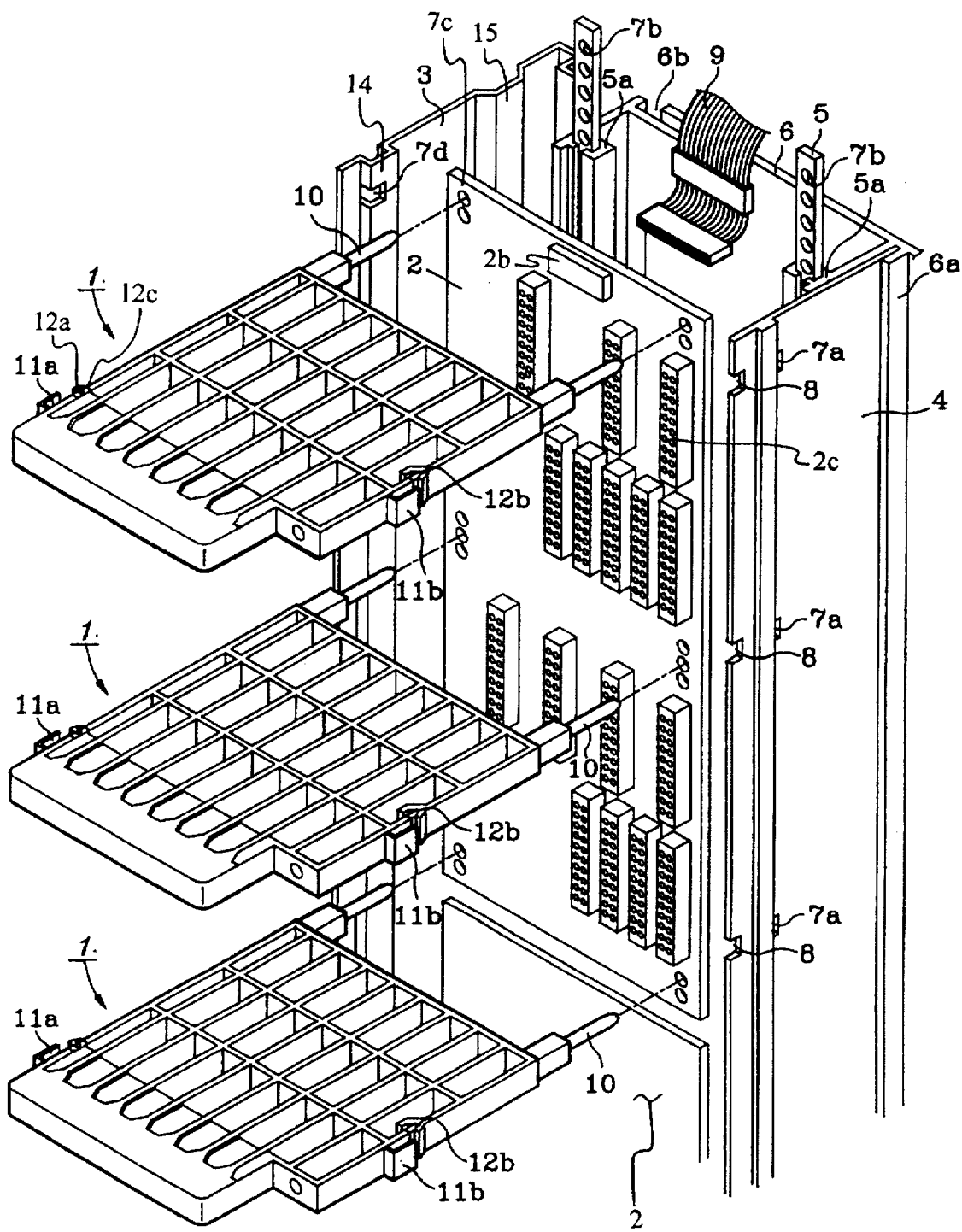
FIG. 2 is an exploded perspective view of a rack constructed as a preferred embodiment of the present invention.
Figure 3A:
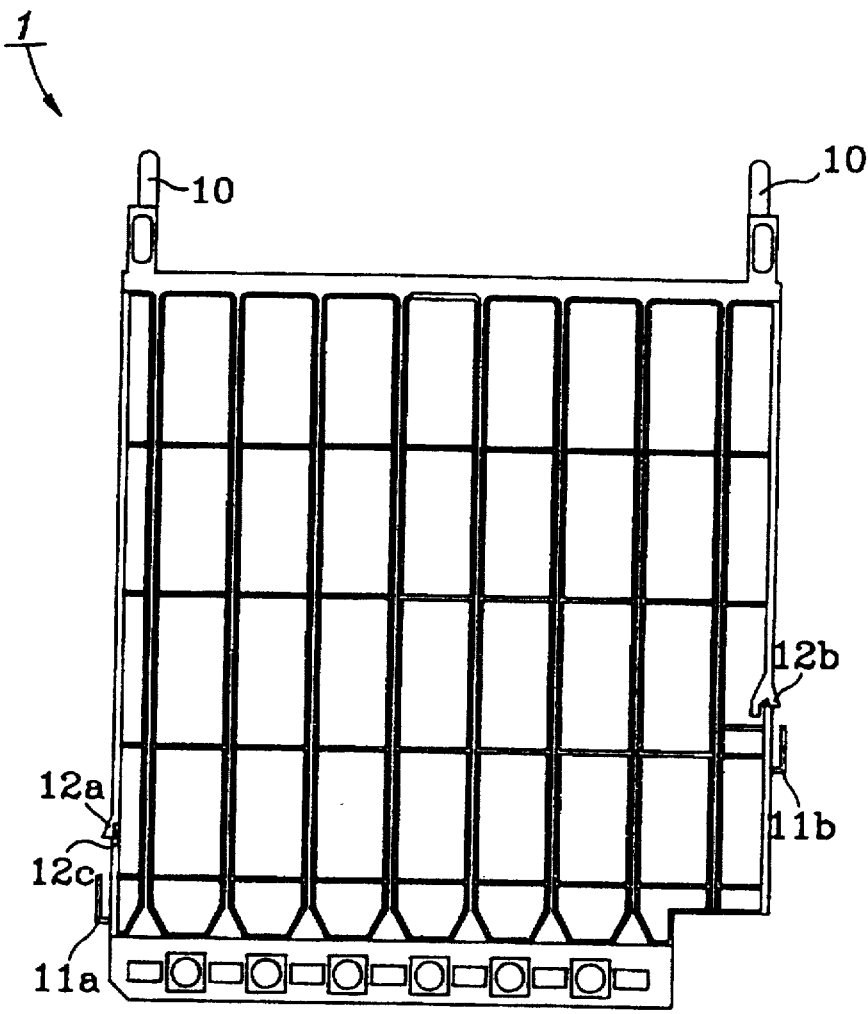
FIG. 3A is top view of a guide plate constructed according to the principles of the present invention.
Figure 3B:
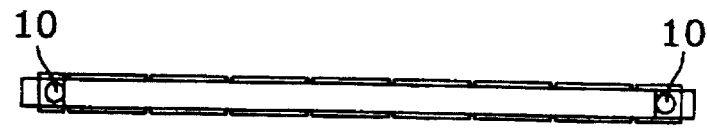
FIG. 3B is a rear view of a guide plate constructed according to the principles of the present invention.
Figure 3C:
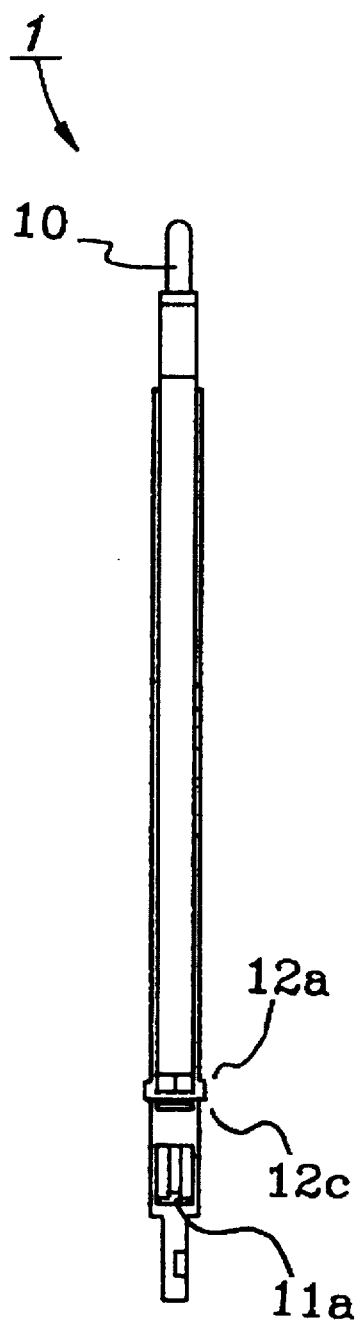
FIG. 3C is a side view of a guide plate constructed according to the principles of the present invention.
Figure 3D:
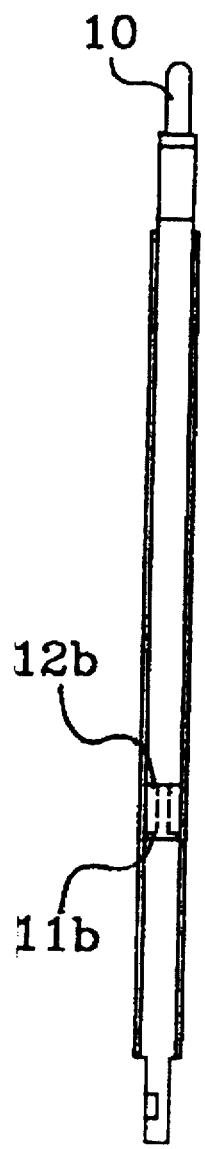
FIG. 3D is another side view of a guide plate constructed according to the principles of the present invention.
Figure 4:
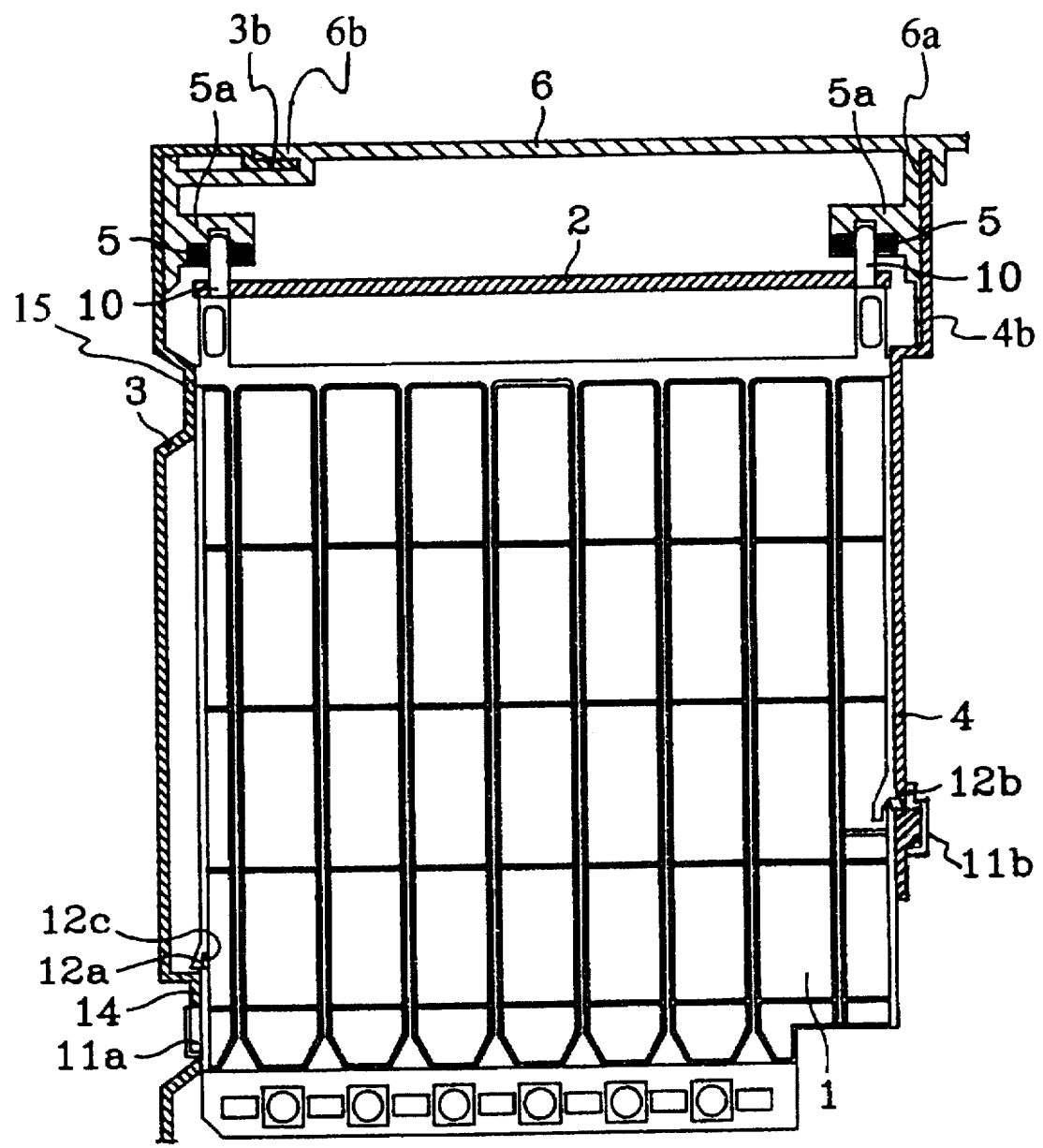
FIG. 4 illustrates a rack constructed as an alternative embodiment according to the principles of the present invention, with a guide plate installed.

FIGS. 2 through 4 show an overall view of an embodiment of a rack constructed in accordance with the principles of the present invention. A rack of preferred embodiment has several, usually identical, guide plates 1 spaced apart from one another and stacks of backboards 2 end-to-end, as in FIG. 2. Each backboard 2 can receive and support a plurality of guide plates 1. Surrounding these backboards 2 and guide plates 1 are three panels, a first side panel 3, a second side panel 4, and a rear panel 6 form the other three sides of the rack. Thus, the rack includes a first side panel 3, a second side panel 4, a rear panel 6, a backboard 2, and one or more guide plates 1 installed in a spaced-apart array between the side and rear panels and the backboard. First side panel 3 and second side panel 4 are, as is shown by FIG. 4 spaced-apart from the sides of backboard 2. Guide plates 1 connect rear panel 6 and backboard 2 through strips 5. Guide plates 1 separately interlock with first side panel 3 and with second side panel 4.

First side panel 3 is perforated by rectangularly shaped detaining apertures 7d or grooved slot that can attach guides plates 1, an elastic U-shaped rib 14 and an elastic U-shaped rib 15 that prevents slip of position of guide plates 1 upon attachment of guide plates 1 to first side panel 3, and an extension 3b that connects one side of rear panel 6 to first side panel 3. First side panel 3 is always wider than the distance between rear paneL 6 and backboard 2. First side panel 3 is long enough to permit attaching a plurality of guide plates 1.

Second side panel 4 has detaining apertures 7a or closed slot detaining apertures or open slot 8 that can attach guide plates 1 to first side panel 3, and extension 4b that connects a side of rear panel 6 (a different side than the side of backboard 2 that is attached to first side pane 3) to second side panel. Second side panel 4 is always wider than the distance between rear panel 6 and backboard 2. Second side panel 4 is long enough to permit attaching a plurality of guide plates 1.

Rear panel 6 connects to the other panels (first side panel 3 and second side panel 4), backboards 2, and guide plates 1. At rear panel 6, a flange 6a protrudes to detain the second side panel at one side of a rear panel 6. Longitudinal strip detaining units 5a are at both sides of rear panel 6 to guide and detain strips 5. A flange 6b connects the first side panel 3 to the other side of rear panel 6. A rib exists to strengthen the rear panel. The rod-shaped (longitudinal) strips 5 are inserted into the strip detaining units 5a of rear panel 6. A plurality of precisely centered, center-to-center spaced, space-apart holes 7b are formed on each of strips 5 so that a guide pin 10 of guide plate 1 is inserted into a corresponding one of holes 7b, to guide and securely detain guide plate 1.

A plurality of guide plates 1 are installed for constructing a shelf-locking apparatus. In each of the guide plates 1, there is a cantilevered guide piece 11b and detaining tab 12b for moving into the detaining aperture 7a and detaining aperture 8 of the second side panel 4. Cantilevered guide piece 11b and detaining tab 12b insert and detain, thus installing onto the right side of guide plate 1. This prevents the deviation of the second side panel 4 (left and right) and the drooping caused by the load during PBA mounting.

The guide piece 11b, bent at a right angle and into which one end of the second side panel 4 is inserted, is elastic. The elasticity of guide piece 11b strongly supports the second side panel 4. Also, in each of the guide plates 1, there is provided a cantilevered guide piece 11a for guiding into the detaining aperture 7d of the first side panel 3. The piece 11a inserts into detaining aperture 7d and detains the first side panel 3. Thus, installing the left side of guide plate 1. This prevents-the deviation of the side panel 3 and 4 (left and right) and the drooping by the load caused during PBA mounting. The guide piece 11a, bent at a right angle and into which one end of the first side panel 3 is inserted, is elastic. The elasticity of guide piece 11a strongly supports the first side panel 3.

During attachment of the guide plate 1, a detaining tab 12b hooks towards the guide piece 11b of the guide plate 1, using the, elasticity of detaining tab 12b, into the detaining aperture 8 of the second side panel 4. Also, a detaining tab 12a to be implemented by its own elasticity, is provided about the guide piece 11a of the guide plate 1. During installation and removal of the guide plate 1, detaining tab 12a detains the guide plate 1 and meets the rib 14 of the first side panel 3. At the detaining tab 12b, capable of hooking into the detaining aperture 7a of the second side panel 4, has a hook that attaches by temporary deformation. Also, the hook 12a meeting the rib 14 of the first side panel 3 has a hook that attaches by temporary deformation. Near the hook 12a, there is a tab 12c projecting upward.

A guide pin 10 passes through the guide aperture 7c and the guide hole 7b of the strip 5 to attach to the backboard 2 and the rear panel 6. The guide pin 10 protrudes from the rear of the guide plate 1. The guide pin passes through backboard 2, maintaining the match among the guide plates 1 and preventing the warping of the backboard 2. The guide pin 10 force fits or tight fits to a corresponding guide aperture 7c of backboard 2.

Backboard 2 holds electrical components of a rack, such as a connector 2b capable of connecting to a fiat cable 9. Connectors 2c hold other electrical components. Electrical sockets on backboard 2 extend through backboard 2. Backboard 2 has guide apertures 7c that receives guide pins 10 of guide plates 1. Guide apertures 7c are coaxially aligned with each other. As shown in FIG. 2, a set of guide permissible guide apertures 7c exist per guide pin 10. By having guide pins 10 secured to rear panel 6, guide plates 1 secure backboard 2 to the rear panel 6. Guide pins 10 go through guide apertures 7c before going through guide holes 7b, the diameter of guide apertures 7c are greater than that of guide holes 7b.

FIGS. 2 through 4 indicate how to construct such a rack. After the second side panel 4 and first side panel 3 are connected to the rear panel 6 as noted above, the strip 5 is inserted into the strip detaining unit 5a. Then, the guide pin 10 is inserted into the guide aperture 7b of a desired position, thereby completing the basic structure of the present invention. The rack of the present invention permits self-mounting without using fasteners such as nuts and bolts by using pins of a guide plate 1 through guide hole 7c of the backboard 2 and through one of the holes 7b, through strip 5.

As described above, a simple shelf-locking apparatus for telecommunications equipment is realized so that components for racks mounting several accurate spaced-apart shelves are minimized and used. The present invention provides a guide plate for a rack, which, unlike the conventional practice, provides a keystone piece for a self-locking structure. Also, guide plates are inserted in a proper interval, thereby realizing a precise structure. The interchangeability of parts improves productivity. Further, the production quality can be stabilized and the system cost can be saved.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A rack for a communication system, comprising:

a backboard having a first side, a second side, and a connector connectable to an electrical communication cable, said backboard perforated with a plurality of aligned and spaced-apart guide apertures exhibiting a center-to-center spacing;

a first side panel having an open slot and a closed slot, said first side panel being spaced-apart from said first side of said backboard a second side panel having a grooved slot, said second side panel being spaced-apart from said second side of said backboard;

a rear panel having a first flange detaining said first side panel, a second flange detaining said second side panel, and first and second longitudinal detaining units, first and second strips each bearing a column of discrete guide holes exhibiting said center-to-center spacing, said first and second longitudinal detaining units located at sides of said rear panel, each of the strips being insertable into different ones of said detaining units; and a plurality of guide plates, each of said guide plates having a rear and a plurality of guide pins projecting outwardly from said rear within planes defined by corresponding ones of said plates, said guide plates being connected to said first side panel, said second side panel, said backboard, and said rear panel, said guide pins passing through said guide apertures of said backboard and tightly fitting into said guide holes of corresponding ones of the strips, said strips being detained in corresponding ones of said longitudinal detaining units of said rear panel, attaching said rear panel to said backboard, and said guide pins detaining said backboard while maintaining mutual separation among said guide plates.

2. The rack for a communication system as claimed in claim 1, wherein each of said guide plates further comprises a first guiding piece having parts insertable into said open slot and said closed slot of said first side panel.

3. The rack for a communication system as claimed in claim 1, wherein a plurality of said guide plates further comprises a second guiding piece insertable into said grooved slot of said second side panel.

4. The rack for a communication system as claimed in claim 2, wherein said first guiding piece of said guide plate further comprises a first elastic hook attaching said guide plate to said first side panel by temporary deformation of said first elastic hook.

5. The rack for a communication system as claimed in claim 4, wherein said second guide piece of said guide plate further comprises a second, elastic hook attaching said guide plate to said second side panel by temporary deformation of said second elastic hook; and a tab, hooking upward from said guide plate, and attaching said guide plate to said second side panel by pressing against said second side panel.

6. The rack for a communication system as claimed in claim 1, wherein said first side panel further comprises a rib that is partially coextensive with said guide plate.

7. The rack for a communication system as claimed in claim 1, wherein said second side panel further comprises a first rib and a second rib that are partially coextensive with said guide plate, said first rib being coplanar with said second rib.

8. A rack for a communication system, comprising:

a backboard having a first side, a second side, and a connector connectable to an electrical communication cable, said backboard perforated with a plurality of aligned and spaced-apart guide apertures exhibiting a center-to-center spacing;

a first side panel having an open slot and a closed slot, said first side panel being spaced-apart from said first side of said backboard;

a second side panel having a grooved slot, said second side panel being spaced-apart from said second side of said backboard;

a rear panel having a major planar member spaced-apart from said backboard, a first flange detaining said first side panel, a second flange detaining said second side panel, and first and second longitudinal detaining units, first and second strips each bearing a column of discrete guide holes exhibiting said center-to-center spacing;

said first and second longitudinal detaining units located at sides of said rear panel, each of the strips being insertable into and held spaced-apart from said major planar member by different ones of said detaining units; and a plurality of guide plates, each of said guide plates having a rear and a plurality of guide pins projecting outwardly from said rear within planes defined by corresponding one of said plates, said guide plates being connected to said first side panel, said second side panel, said backboard, and said rear panel, said guide pins passing through said guide apertures of said backboard and lightly fitting into said guide holes of corresponding ones of the strips, said strips being detained in corresponding one of said longitudinal detaining units of said rear panel, attaching said rear panel to said backboard, and said guide pins engaging said backboard while maintaining mutual separation among said guide plates.

9. The rack for a communication system as claimed in claim 8, wherein each of said guide plates further comprises a first guiding piece having parts insertable into said open slot and said closed slot of said first side panel.

10. The rack for a communication system as claimed in claim 8, wherein each of said guide plate further comprises a second guiding piece insertable into said grooved slot of said second side panel.

11. The rack for a communication system as claimed in claim 9, wherein said first guiding piece of said guide plate further comprises a first elastic hook attaching said guide plate to said first side panel by temporary deformation of said first elastic hook.

12. The rack for a communication system as claimed in claim 11 wherein said second guide piece of said guide plate further comprises a second, elastic hook attaching said guide plate to said second side panel by temporary deformation of said second elastic hook; and a tab, hooking upward from said guide plate, and attaching said guide plate to said second side panel by pressing against said second side panel.

13. The rack for a communication system as claimed in claim 8, wherein said first side panel further comprises a rib that is partially coextensive with said guide plate.

14. The rack for a communication system as claimed in claim 8, wherein said second side panel further comprises a first rib and a second rib that are partially coextensive with said guide plate, said first rib being coplanar with said second rib.

15. The rack for a communication system as claimed in claim 8, wherein said guide pins are elongated in a direction from said rear of said guide plate, said guide pins passing through said guide apertures of said backboard and tightly fitting into said guide holes of corresponding ones of the strips, said strips being detained in corresponding one of said longitiudinal detaining units of said rear panel, attaching said rear panel to said backboard, and said guide pins detaining said backboard with said guide plates maintaining mutual separation among said guide plates and with preventing a deviation of said backboard, said guide plate maintaining separation between said backboard and said rear panel.

16. A rack for a communication system, comprising:

a backboard having a first side, a second side, and a connector connectable to an electrical communication cable, said backboard perforated with a plurality of aligned and spaced-apart guide apertures exhibiting a center-to-center spacing;

a first side panel having an open slot and a closed slot, said first side panel being spaced-apart from said first side of said back a second side panel having a grooved slot, said second side panel being spaced-apart from said second side of said backboard;

a rear panel having a first flange detaining said first side panel, a second flange detaining said second side panel, and first and second longitudinal detaining units, first and second strips each bearing a column of discrete guide holes exhibiting said center-to-center spacing;

said first and second longitudinal detaining units located at sides of said rear panel, each of the strips being insertable into different ones of said detaining units; and a plurality of guide plates, each of said guide plates having:

a rear, a plurality of guide pins projecting outwardly from said rear within planes defined by corresponding one of said plates, a first elastic hook attaching said guide plate to said first side panel by temporary deformation of said first elastic hook, a second, elastic hook attaching said guide plate to said second side panel by temporary deformation of said second elastic hook, and a tab, hooking upward from said guide plate, and attaching said guide plate to said second side panel by pressing against said second side panel, said guide plates being connected to said first side panel, said second side panel, and said backboard, said guide pins passing through said guide apertures of said backboard and tightly fitting into said guide holes of corresponding ones of the strips, said strips being detained in corresponding one of said longitudinal detaining units of said rear panel, attaching said rear panel to said backboard, and said guide pins engaging said backboard maintaining mutual separation among said guide plates.

17. The rack of claim 1, with said rear panel further comprising:

said first flange, separated by a major surface defining a first plane, from said second flange, said first flange matingly engaging a terminal portion of side fist said panel during relative movement within said first plane between said first flange and said terminal portion of said first side panel; and said second flange matingly engaging a terminal portion of said second side panel during relative movement between said second flange and said terminal portion of said second side panel within a second plane obliquely intersecting said first plane.

18. The rack of claim 8, with said rear panel further comprising:

said first flange matingly engaging a terminal portion of said first side panel during relative movement within said first plane between said first flange and said terminal portion of said first side panel; and said second flange matingly engaging a terminal portion of said second side panel during relative movement between said second flange and said terminal portion of said second side panel within a second plane obliquely intersecting said first plane.

19. The rack of claim 16, with said rear panel further comprising:

said first flange, separated by a major surface defining a first plane, from said second flange said first flange matingly engaging a terminal portion of said first side panel during relative movement within said first plane between said first flange and said terminal portion of said first side panel; and said second flange matingly engaging a terminal portion of said second side panel during relative movement between said second flange and said terminal portion of said second side panel within a second plane obliquely intersecting said first plane.

20. A rack for communication system, comprising:

a back board having a first side, and a connector connectable to a electrical communication cable, said back board being perforated with a first ordered array formed by a plurality of guide apertures;

a first side panel having a first detaining aperture and a detaining groove, said first side panel being spaced-apart from said first side of said back board;

a second side panel having a second detaining aperture, said second side panel being spaced-apart from said second side of said back board;

an elongated member perforated by a second plurality of apertures disposed in a second ordered array conforming to said first ordered array;

a rear panel having a major surface, a first flange for slidingly engaging a terminal portion of said first side panel, a second flange for slidingly engaging a terminal portion of said second side panel, and first and second supports maintaining said elongated member spaced-apart from said major surface with second plurality of apertures in said second ordered array in coaxial alignment with corresponding said guide apertures in said first ordered array; and a plurality of guide plates, each of said guide plates having guide pins and a rear, said guide plates being connected to said first side panel, said second side panel, and said back board.

* * * * *